United States Patent
Miyamoto et al.

(10) Patent No.: US 10,859,916 B2
(45) Date of Patent: Dec. 8, 2020

(54) COMPOSITION FOR FORMING FINE PATTERN AND METHOD FOR FORMING FINE PATTERN USING THE SAME

(71) Applicant: AZ Electronic Materials (Luxembourg) S.a.r.l., Luxembourg (LU)

(72) Inventors: Yoshihiro Miyamoto, Ichikawa (JP); Tomohide Katayama, Kakegawa (JP); Takayuki Sao, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 16/084,615

(22) PCT Filed: Feb. 27, 2017

(86) PCT No.: PCT/EP2017/000267
§ 371 (c)(1),
(2) Date: Sep. 13, 2018

(87) PCT Pub. No.: WO2017/157506
PCT Pub. Date: Sep. 21, 2017

(65) Prior Publication Data
US 2019/0079398 A1      Mar. 14, 2019

(30) Foreign Application Priority Data

Mar. 15, 2016    (JP) ................. 2016-051545

(51) Int. Cl.
*G03F 7/40*    (2006.01)
*G03F 7/32*    (2006.01)
(Continued)

(52) U.S. Cl.
CPC .............. *G03F 7/40* (2013.01); *C08F 226/06* (2013.01); *C08F 226/10* (2013.01); *G03F 7/004* (2013.01);
(Continued)

(58) Field of Classification Search
CPC . G03F 7/40; G03F 7/405; G03F 7/322; C08F 226/06; C08F 226/10
(Continued)

(56) References Cited

U.S. PATENT DOCUMENTS

| | | |
|---|---|---|
| 5,264,324 A | 11/1993 | Emmelius et al. |
| 2005/0245663 A1 | 11/2005 | Sugeta et al. |

(Continued)

FOREIGN PATENT DOCUMENTS

| | | |
|---|---|---|
| EP | 2146250 A1 | 1/2010 |
| JP | 2662083 B2 | 10/1997 |

(Continued)

OTHER PUBLICATIONS

International Search Report for PCT/EP2017/000267 dated Jun. 21, 2017.
Written Opinion of the International Searching Authority for PCT/EP2017/000267 dated Jun. 21, 2017.

*Primary Examiner* — John S Chu
(74) *Attorney, Agent, or Firm* — Faegre Drinker Biddle & Reath LLP

(57) ABSTRACT

[Problem] To provide a composition for forming a fine pattern having a good pattern shape even after being applied to a thick-film resist, a high size reduction rate and less defects, as well as a method for forming a fine pattern using the same.

[Means for Solution] A composition comprising vinyl resin, an amine compound having a specific cage-type three-dimensional structure and a solvent, and a method for forming a fine pattern using the same.

17 Claims, 2 Drawing Sheets

(51) Int. Cl.
*G03F 7/04* (2006.01)
*C08L 29/14* (2006.01)
*C08F 226/10* (2006.01)
*C08F 226/06* (2006.01)
*G03F 7/033* (2006.01)
*G03F 7/004* (2006.01)
*G03F 7/031* (2006.01)

(52) U.S. Cl.
CPC .............. *G03F 7/031* (2013.01); *G03F 7/033* (2013.01); *G03F 7/322* (2013.01); *C08L 29/14* (2013.01)

(58) Field of Classification Search
USPC .......................................................... 430/331
See application file for complete search history.

(56) References Cited

U.S. PATENT DOCUMENTS

| | | | |
|---|---|---|---|
| 2009/0317742 A1* | 12/2009 | Toriumi | G03F 7/0042 430/270.1 |
| 2010/0119717 A1 | 5/2010 | Hong et al. | |
| 2015/0277228 A1 | 10/2015 | Namiki et al. | |
| 2019/0155162 A1 | 5/2019 | Meya et al. | |

FOREIGN PATENT DOCUMENTS

| | | |
|---|---|---|
| JP | 2008275995 A | 11/2008 |
| JP | 2011221494 A | 11/2011 |
| JP | 2016194676 A | 11/2016 |
| WO | WO-2012148533 A1 | 11/2012 |

* cited by examiner

COMPOSITION FOR FORMING FINE PATTERN AND METHOD FOR FORMING FINE PATTERN USING THE SAME

CROSS-REFERENCE TO RELATED APPLICATIONS

This application is a national stage application (under 35 U.S.C. § 371) of PCT/EP2017/000267, filed Feb. 27, 2017, which claims benefit of Japanese Application No. 2016-051545, filed Mar. 15, 2016, both of which are incorporated herein by reference in their entirety.

BACKGROUND OF THE INVENTION

Technical Field

The present invention relates to a composition for forming a fine pattern, which can form a finer pattern by reducing a separation size between resist patterns or a pattern aperture size, which is already formed upon forming resist patterns in a semiconductor process, and to a method for forming a pattern using the fine pattern-forming composition.

Background Art

In the field of semiconductor devices, it is desired to make the products smaller, thinner, and lighter. In coping therewith, high integration and high definition of semiconductor devices have been studied. In the manufacture of semiconductor devices, generally, a fine pattern is formed by photolithography technique, and etching of various substrates as a base using the formed resist pattern as a mask, ion doping and forming a metal wiring using an electrolytic plating method are performed. Therefore, in making fine the wiring for semiconductor devices, it is very effective to improve the photolithographic technique used in a resist pattern formation.

Here, the photolithographic technique is generally comprised of a combination of each process such as resist coating, masking, exposure and development. In order to obtain a fine pattern, it is generally desirable to expose with a short wavelength light. However, since light sources of such a short wavelength light are very expensive, it is undesirable from the viewpoint of manufacturing cost. Further, in the photolithography technique utilizing conventional exposure methods, it is difficult to form a fine resist pattern that exceeds wavelength limit of exposure wavelength.

Accordingly, without using the expensive apparatus, several methods, wherein a resist pattern is formed using a conventionally known positive- or negative-working photosensitive resin composition by means of a conventionally known pattern-forming apparatus and the formed resist pattern is effectively made fine, have been intensively studied. As one method for effectively making the resist pattern fine, a method for effectively forming a fine resist pattern with the limit of resolution or less by following processes has been proposed. That is, after a pattern is formed from a conventionally known photosensitive resin composition such as a chemically amplified photoresist by a conventional method, a coated layer composed of a composition for forming a fine pattern containing a water-soluble resin is applied onto the formed resist pattern, the resist is heated or the like to form a mixing layer between the coated layer and the resist pattern. Thereafter, a part of the coated layer is removed to thicken the resist patterns. As a result, the width of a gap between a resist pattern and a resist pattern is decreased, the resist pattern is made fine by reducing the separation size of the resist patterns or the size of a hole opening, and a fine resist pattern with the limit of resolution or less is effectively formed.

For example, Patent Document 1 discloses a method for making a resist pattern fine using a composition comprising vinyl resin and an amine compound.

PRIOR ART DOCUMENTS

Patent Documents

[Patent document 1] JPA-2008-275995

SUMMARY OF THE INVENTION

Problems to be Solved by the Invention

While a finer resist pattern is required, in order to respond to the ion implantation of high-energy or the like, a resist pattern that is thicker and has a high aspect ratio has been required. The present inventors have found that, different from a thin-film resist pattern, in case of a thick-film resist pattern, there are some problems that are occurrence of dissolution of the resist pattern, difficulty of making the resist pattern uniformly fine or the like. Therefore, development of a composition for forming a fine pattern, which is applicable to a thick-film resist and has a good pattern shape after application, a high size reduction rate and less defects, has been desired.

The present invention has been accomplished on the basis of the circumstances as described above and provides a composition for forming a fine pattern having a good pattern shape even after being applied to a thick-film resist, a high size reduction rate and less defects, as well as a method for forming a fine pattern using the same. Further, according to the present invention, an element containing the fine pattern formed by the method for forming a fine pattern and having excellent properties is provided.

Means for Solving the Problems

The composition according to the present invention is characterized by comprising:
vinyl resin;
an amine compound represented by the following formula (I):

[Formula 1]

in which $L^1$, $L^2$ and $L^3$ are each independently a divalent group formed by binding identical or different, two or three bonding units selected from the group consisting of —$CR_2$— (R is each independently hydrogen or an alkyl having 1 to 6 carbon atoms), —(C=O)— or —O—, and $L^1$, $L^2$ and $L^3$ respectively comprise at least one —$CR_2$—; and a solvent.

Further, the method for forming a fine pattern according to the present invention is characterized by comprising:

a step of forming a resist pattern on a substrate;
a step of applying the composition according to the present invention on the resist pattern to form a composition layer;
a step of mixing bake of the resist pattern and the composition layer to form an insolubilized layer in the composition layer; and
a step of removing the composition layer other than the insolubilized layer.

Effects of the Invention

According to the present invention, a fine pattern-forming composition having excellent embedding properties in the space portion or the contact hole portion with respect to the resist pattern is provided. According to this composition, a resist pattern can be precisely made fine. In addition, the resist pattern formed using this composition can satisfactorily and economically form a pattern having high size reduction rate of the space portion and less defects and exceeding the wavelength limit. Further, using the fine resist pattern formed in this manner as a mask, a reduced pattern can be formed on a substrate and an element or the like having a fine pattern can be produced easily and with high yield.

According to the method for forming a fine pattern according to the present invention, in a dry etching method, a wet etching method, an ion implantation method, metal plating method and the like, a pattern of high aspect ratio can be made fine up to the resolution limit of exposure wavelength or less.

DETAILED DESCRIPTION OF THE INVENTION

Figure 1:
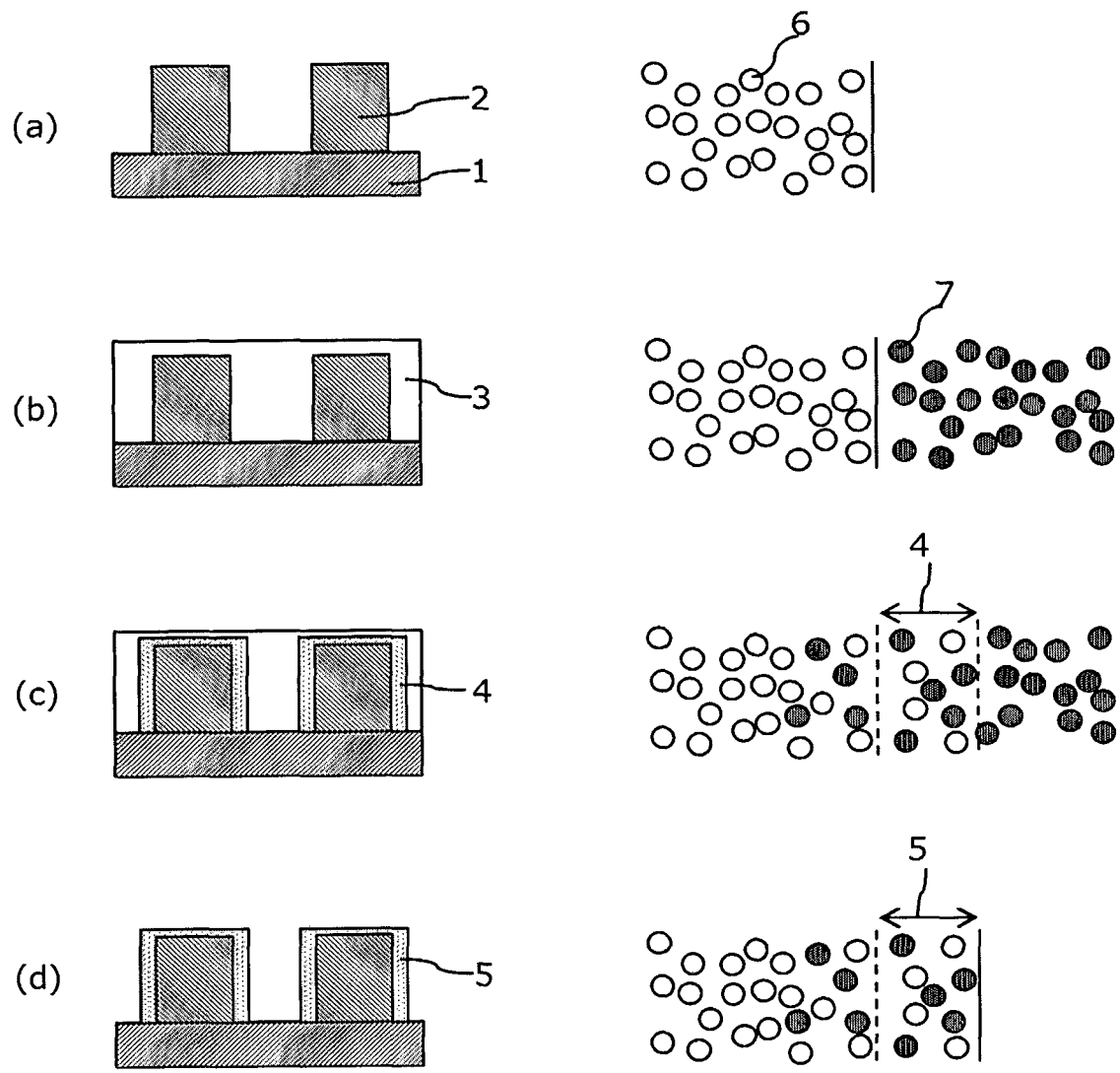
FIG. 1 is an illustrative figure (left) for explaining a method for forming a pattern made fine using the composition of the present invention and an image figure (right) showing the movement of molecule.

Mode for Carrying Out the Invention
Composition
The composition according to the present invention comprises vinyl resin, a specific amine compound and a solvent. Further, it may optionally comprise other ingredients. Each of these components will be explained below.
(1) Vinyl Resin
Vinyl resin used in the fine pattern-forming composition of the present invention is a vinyl copolymer resin prepared using vinyl imidazole as one of the copolymer monomer components. Vinyl resin is preferably water-soluble. In the present invention, a water-soluble vinyl resin is referred to as a case wherein 2 g or more, preferably 5 g or more, more preferably 10 g or more of resin can be dissolved in 100 g of water at 25° C.
In the present invention, examples of preferred vinyl resin are copolymers composed of one or more vinyl monomers containing vinyl imidazole and a nitrogen atom, or copolymers composed of vinyl imidazole or one or more vinyl monomers containing vinyl imidazole and a nitrogen atom and one or more vinyl monomers containing no nitrogen atom. Examples of the vinyl monomer containing a nitrogen atom are allylamine, acrylamide, vinyl pyrrolidone, vinyl caprolactam and the like.

Reason for using monomers other than the nitrogen atom-containing monomer in the copolymer is to prevent blocking of the monomer component in the copolymer. Thereby, localization of the chemical reaction caused by blocking of the vinylimidazole monomer is prevented and imbalance of hydrophilic-hydrophobic can be improved. Accordingly, the other monomer may be any one that can attain the object of the present invention. Preferred monomers contain (meth) acrylic acid, (meth) acrylic acid ester, hydroxyalkyl (meth) acrylate, vinyl alkylate, vinyl hydroxy alkylate and the like. In the present invention, the term "(meth) acryl" is used to be collectively referred to as "acryl" and "methacryl".

Further, in the present invention, it is preferable to use vinyl imidazole as one of the copolymer monomer components. This is because when vinylimidazole is used as a copolymerizable monomer component, N-heterocyclic ring of the vinyl imidazole monomer part in the copolymer resin reacts with an ester compound such as a carboxylic acid and an acetal, and a high polarity functional group such as phenol, which are present in the resist, to cause formation of salts and formation of intermolecular bonds, thereby an insoluble layer is easily formed. Further, this is because due to high hydrophobicity of the vinylimidazole monomer moiety, by introducing a hydrophilic group into a monomer moiety other than the vinylimidazole monomer moiety, hydrophilic-hydrophobic balance can be relatively easily adjusted, which is advantageous for improvement of mixing properties. Preferred example of the copolymer using a vinyl imidazole monomer is a copolymer composed of a nitrogen atom-containing vinyl monomer other than vinylimidazole (a-1) and vinylimidazole (a-2), for example, a copolymer composed of at least one monomer selected from the group consisting of allylamine, acrylamide, vinyl pyrrolidone or vinyl caprolactam, and vinylimidazole; and a terpolymer composed of a nitrogen atom-containing vinyl monomer other than vinylimidazole (a-1), vinylimidazole (a-2) and a monomer other than these (b), for example, a copolymer composed of at least one monomer selected from the group consisting of allylamine, acrylamide, vinyl pyrrolidone or vinyl caprolactam, vinylimidazole and a monomer other than these.

In the copolymer, the ratio of the nitrogen atom-containing vinyl monomer other than vinylimidazole (a-1), vinylimidazole (a-2) and the other monomer (b) may be any and is not particularly limited. However, usually, (a-1):(a-2) is preferably 0.1:99.9 to 99.9:0.1 in terms of a molar ratio, and [total amount of (a-1)+(a-2)]:b is preferably 70:30 to 99.9:0.1 in terms of a molar ratio.

Among the preferable polymers, particularly preferable ones contain a copolymer of vinyl pyrrolidone and vinyl imidazole, and a copolymer composed of vinyl pyrrolidone, vinylimidazole and at least one of (meth) acrylic acid ester, hydroxyalkyl (meth) acrylate, vinyl alkylate and vinyl hydroxy alkylate, which is represented by the following general formula (II).

[Formula 2]

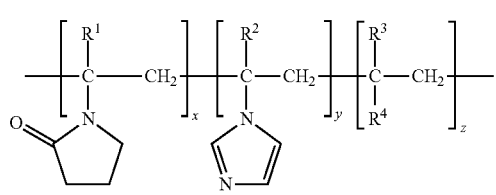

(II)

in which
$R^1$, $R^2$ and $R^3$ are each independently a hydrogen atom or methyl, $R^4$ is alkyloxycarbonyl, hydroxy alkyloxycarbonyl, alkylcarbonyloxy or hydroxy alkylcarbonyloxy, where alkyl is a straight-chain or branched $C_{1-6}$ alkyl; x, y and z are respectively an integer of 5 to 1000. Each of the repeating units may be randomly bonded, regularly bonded, or bonded in a block.

Preferable groups as the above-mentioned alkyloxycarbonyl, hydroxy alkyloxycarbonyl, alkylcarbonyloxy or hydroxy alkylcarbonyloxy are —COOCH$_3$, —COO—(CH$_2$)$_s$—CH$_2$—OH, —OCOCH$_3$, —OCO—(CH$_2$)$_t$—CH$_2$—OH, wherein s and t are an integer of 1 to 5.

The molecular weight of vinyl resin of the present invention is not particularly limited; however, in view of coatability and filterability, it is preferably from 5,000 to 500,000, more preferably from 10,000 to 50,000 in weight-average molecular weight. If the molecular weight is less than 5,000, coatability is poor, and thereby it becomes difficult to obtain a uniform coating film and also temporal stability of the coating film decreases. On the other hand, if the molecular weight exceeds 500,000, stringing phenomenon generates at the time of coating and spreading to the resist surface is poor, thereby making it impossible to obtain a uniform coating film with a small quantity of dropping amount. Furthermore, in many cases, transparency of filter is poor.

The content of vinyl resin may be arbitrarily selected; however, it is necessary to increase the solid content concentration in order to coat a film thicker. Specifically, the content of vinyl resin is preferably 10 to 40 parts by mass, preferably 10 to 20 parts by mass based on 100 parts by mass of the composition according to the present invention. From the viewpoint of preventing void formation, it is preferably not more than 20 parts by mass based on 100 parts by mass of the fine pattern-forming composition, and also it is preferably not less than 10 parts by mass based on 100 parts by mass of the fine pattern-forming composition to maintain the embedding rate high.

(2) Amine Compound

The composition according to the present invention comprises a specific amine compound represented by the following general formula (I):

[Formula 3]

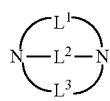

(I)

in which $L^1$, $L^2$ and $L^3$ are each independently a divalent group formed by binding identical or different, two or three bonding units selected from the group consisting of —CR$_2$— (R is each independently hydrogen or an alkyl having 1 to 6 carbon atoms), —(C=O)— or —O—, and $L^1$, $L^2$ and $L^3$ respectively comprise at least one —CR$_2$—.

Functions of the fine pattern-forming composition of the present invention are assumed as described below, but it does not limit the present invention at all. When the known fine pattern-forming composition is applied onto a resist pattern and the pattern is treated for fine processing, resin and an amine compound, which are contained therein, can penetrate excessively into the resist pattern, and can dissolve the resist pattern. Due to such a phenomenon, the resist pattern shape sometimes deteriorated. It was considered that liquid content of a thick-film resist pattern after patterning was higher compared with the case of thin-film and that the conventional fine pattern-forming composition easily caused penetration into the resist pattern. In contrast, according to the study by the present inventors, it has been found that using a composition containing a specific amine compound represented by the above-mentioned general formula (I), to make the pattern fine is possible while suppressing the deterioration of the resist pattern shape. That is, it is considered that the amine compound represented by the formula (I) penetrates from the composition into the resist pattern to make the resist expand during the mixing bake, which is described later, and makes vinyl resin contained in the composition easily penetrate, thereby the intermixing between the resist pattern and the composition components in the vicinity of the interface is more smoothly performed. As represented by the formula (I), this amine compound has a three-dimensional structure in which mother skeleton itself is cage-type. It is considered that by having such a bulky structure, while suppressing the excessive penetration of the amine compound itself into the resist pattern to dissolve the resist pattern, vinyl resin penetrates and making the pattern fine is achieved.

In the above general formula (I), R is preferably, for example, hydrogen, methyl, ethyl, n-propyl, isopropyl, n-butyl, isobutyl, s-butyl, t-butyl, n-pentyl, n-hexyl, cyclopropyl, cyclopentyl, cyclohexyl or the like. Preferably, R is hydrogen, methyl or ethyl. More preferably, R is hydrogen.

Preferably, $L^1$ contains two or more —CR$_2$—. Preferably, $L^1$ and $L^2$ contain each two or more —CR$_2$—. More preferably, $L^1$, $L^2$ and $L^3$ contain each two or more —CR$_2$—.

Preferably, $L^1$ is a divalent group formed by binding two bonding units described above. Preferably, $L^1$ and $L^2$ are each a divalent group formed by binding two bonding units described above. More preferably, $L^1$, $L^2$ and $L^3$ are each a divalent group formed by binding two bonding units described above.

Specifically, the compound represented by the general formula (I) is, as a representative example, 1,4-diazabicyclo[2.2.2]octane, 2-methyl-1,4-diazabicyclo[2.2.2]octane, 1,4-diazabicyclo[2.2.2]octane-2-one, 1,4-diaza-2-oxabicyclo[2.2.2]octane, 1,5-diaza-bicyclo-[3.2.2]nonane, 1,5-diazabicyclo[3.3.2]decane, 1,5-diazabicyclo[3.3.3]undecane and the like. In addition, it is also possible to use salts of these amine compounds with an acid such as hydrochloric acid, hydrofluoric acid and the like. Specifically, structural formulae of the compounds represented by the general formula (I) are, for example, the following structural formulae.

[Formula 4]

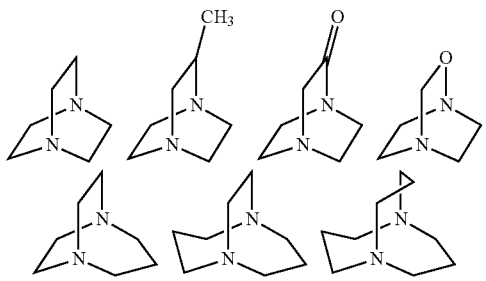

The content of the amine compound according to the present invention is not limited unless it impairs the effects of the present invention, and the mass of the amine compound according to the invention is preferably not less than 0.1 and not more than 0.4, more preferably not less than 0.2 and not more than 0.3 based on the mass of vinyl resin according to the present invention.

(3) Solvent

The solvent used in the fine pattern-forming composition according to the present invention is used to dissolve the above-described vinyl resin, amine compound and other additives that are optionally used. Such a solvent is required not to dissolve the resist pattern. Preferably, it includes water or a solvent containing water. Water used as a solvent is not particularly limited, but water from which organic impurities and metal ions are removed by distillation, ion exchange treatment, filtering, various adsorption treatments and the like, for example, pure water, is preferred.

It is also possible to use by mixing the water-soluble organic solvent with water. Such a water-soluble organic solvent is not particularly limited if 0.1 wt. % or more thereof can be dissolved in water, but is, for example, alcohols such as methyl alcohol, ethyl alcohol, n-propyl alcohol and isopropyl alcohol (IPA); ketones such as acetone and methyl ethyl ketone; esters such as methyl acetate and ethyl acetate; ethylene glycol monoalkyl ethers such as ethylene glycol monomethyl ether and ethylene glycol monoethyl ether; ethylene glycol monoalkyl ether acetates such as ethylene glycol monomethyl ether acetate and ethylene glycol monoethyl ether acetate; propylene glycol monoalkyl ethers such as propylene glycol monomethyl ether and propylene glycol monoethyl ether; propylene glycol monoalkyl ether acetates such as propylene glycol monomethyl ether acetate and propylene glycol monoethyl ether acetate; lactates such as methyl lactate and ethyl lactate; aromatic hydrocarbons such as toluene and xylene; amides such as N, N-dimethylacetamide and N-methylpyrrolidone; lactones such as γ-butyrolactone; and aprotic polar solvents such as N,N-dimethylformamide and dimethyl sulfoxide. Preferred ones include $C_1$-$C_4$ lower alcohols such as methyl alcohol, ethyl alcohol, n-propyl alcohol, isopropyl alcohol and isobutanol; and aprotic polar solvents such as N,N-dimethylformamide and dimethyl sulfoxide. These solvents may be used alone or in combination of two or more thereof. These solvents are used in a range that does not dissolve the resist pattern, onto which the fine pattern-forming composition is applied when they are comprised in the composition.

The composition according to the present invention essentially comprises the above-described (1) to (3), but further compounds can be optionally combined thereto. Explanation about these combinable materials is shown below. The components other than (1) to (3) occupying in the whole composition is preferably 2% or less, more preferably 1% or less, based on overall weight.

(4) Surfactant

Further, surfactants may be used in the fine pattern-forming composition of the present invention to improve its coatability. As the surfactant, arbitrary ones can be used. Examples of the surfactant that can be used in the present invention are (A) an anionic surfactant, (B) a cationic surfactant or (C) a nonionic surfactant. More specifically, (A) alkylsulfonate, alkylbenzene sulfonic acid and alkylbenzene sulfonate; (B) lauryl pyridinium chloride and lauryl methyl ammonium chloride; and (C) polyoxyethylene octyl ether, polyoxyethylene lauryl ether and polyoxyethylene acetylenic glycol ether are preferred. With respect to these surfactants, for example, as an example of a nonionic surfactant, a nonionic alkyl ether-type surfactant manufactured by Nippon Nyukazai Co., Ltd. or the like is commercially available.

(5) Other Additives

For the fine pattern-forming composition according to the present invention, it is possible to use any other additives in a range that does not impair the effects of the present invention. One of such additives is a plasticizer such as ethylene glycol, glycerin and triethyl glycol. In addition, a leveling agent and the like can be also used.

Method for Forming a Fine Pattern

The method for forming a fine pattern according to the present invention is explained below with reference to FIG. 1.

FIG. 1 (a) left figure shows a state where a resist pattern 2 was formed on a substrate 1. Substrate used is not particularly limited, but is, for example, a semiconductor substrate (e.g., a silicon wafer etc.), a glass substrate such as LCD, PDP and the like. On the substrate, a conductive film, a wiring, a semiconductor or the like may be formed. Further, formation of the resist pattern is performed, for example, as follows:

A photoresist is applied on a substrate by a conventionally known method such as a spin coating and prebaked (for example, baking temperature at 70 to 140° C. and for about 1 minute). Thereafter, ultraviolet ray such as g-line and i-line, deep ultraviolet ray such as KrF excimer laser and ArF excimer laser light, X-ray or an electron beam is exposed and post-exposure bake (PEB) (for example, baking temperature at 50 to 140° C.) is optionally carried out. Thereafter, development is carried out and bake after development (for example, baking temperature at 60 to 120° C.) is optionally carried out. The resist pattern to which the composition according to the present invention is applied is a resist for KrF excimer laser, whose film thickness after prebaking is preferably not less than 1 µm and not more than 10 µm, more preferably not Iress than 1 µm and not more than 5 µm.

FIG. 1 (b) left figure shows a state where the composition according to the present invention was applied onto the formed resist pattern and a composition layer 3 was formed. FIG. 1 (b) right figure schematically shows molecules of such a state, wherein molecules 6 in the resist and molecules 7 of the composition according to the present invention are present. Application of the composition according to the present invention may be carried out by any conventionally known method such as a spin coating method, a spraying method, a dipping method and a roller coating method. Here, the coating quantity of the composition may be any amount, but it is, for example, preferably about not less than 1 µm and not more than 5 µm (dry film thickness). After coating, prebaking is optionally carried out (for example, at 60 to 90° C. and for 15 to 90 seconds) to form a composition layer.

FIG. 1 (c) left figure shows a state where an insolubilized layer was formed after the heat treatment (mixing bake) of the formed composition layer and the resist pattern. According to the mixing bake, penetration of the amine compound into the resist film is promoted, thereby swelling of the resist film is promoted. Then, vinyl resin becomes easy to penetrate and intermixing can act more smoothly, thereby reduction of a space portion in the fine pattern is promoted. FIG. 1 (c) right figure schematically shows an intermixed state. By mixing bake, the reaction of a nitrogen atom-containing water-soluble vinyl resin with an ester functional group such as a carboxylic acid and an acetal, and a high polarity phenol group etc., which are present in the resist resin, is also promoted. Temperature and baking time of the mixing bake are suitably determined according to the resist used, materials used in the composition according to the present invention and the line width of a target fine pattern. Temperature and baking time of the mixing bake may be usually at a temperature of about 100 to 180° C. and for about 30 to 90 seconds, but the present invention is not limited by them. When the baking temperature becomes higher, the mixing causes more actively, and the insolubilized layer in the composition becomes larger.

FIG. 1 (d) left figure shows a state where a portion other than the insolubilized layer in the composition layer was removed to form a shrink layer 5 by bringing the composition layer in contact with water after the insolubilized layer was formed. For the removal of the portion other than the insolubilized layer, it is not limited to use water, and a mixed solution of water and a water-soluble organic solvent, or an alkali aqueous solution such as TMAH (tetramethylammonium hydroxide) can be also used. Depending on the conditions of removal, the thickness of the insolubilized layer may change. For example, by prolonging the contact time with the liquid, the thickness of the insolubilized layer may become thinner. By the above treatment, a trench pattern or a dot pattern is effectively made fine and it is possible to obtain a fine pattern.

The formed fine pattern is used for processing a substrate. Specifically, using the formed fine pattern as a mask, a various substrates for base can be processed by means of a dry etching method, a wet etching method, an ion implantation method, a metal plating method and the like. Since a fine pattern according to the present invention can have a thick film thickness and a high aspect ratio, it is preferably used in the substrate processing by means of the ion implantation method. In other words, when the impurity doping is performed using the fine pattern as a mask by means of the ion implantation, the impurity doping is done only for the portion not covered with the fine pattern in the ground substrate. In this way, by performing the impurity doping only to a desired region, it becomes possible to form a smaller semiconductor device structure or the like on a substrate. In addition, a circuit structure can be formed by forming a recessed part through etching processing a substrate by means of a dry etching or a wet etching and filling a conductive material in the recessed part, or by forming a metal layer in the portion not covered with the fine pattern by means of a metal plating method.

After the desired processing is performed using the fine pattern as a mask, the fine pattern is removed. Thereafter, if necessary, the substrate is further processed to form an element. To these further processing, any conventionally known method in the art can be applied. After the formation of an element, if necessary, the substrate is cut into chips, connected to a lead frame and packaged with resin. In the present invention, this packaged one is referred to as device.

The present invention is explained below with reference to the following various examples. Embodiments of the present invention are not limited only to these examples.

Example of Resist Pattern Formation

An 8-inches silicon wafer was treated with HMDS (hexamethyldisilazane) using a spin coater (MK-VIII, manufactured by Tokyo Electron Ltd.), coated further with a positive photoresist, AZ TX1311 (manufactured by Merck Performance Materials Limited Liability Company, hereinafter abbreviated as Merck Company) using the same spin coater, and prebaked at 150° C. for 130 seconds on a hot plate to form a resist film having a thickness of about 3.0 µm. Then, the formed resist film was exposed to KrF laser (248 nm) using an exposure apparatus (FPA-3000 EX5, manufactured by Canon Inc., NA=0.55, σ=0.55, Focus Offset=−1.4 µm) and subjected to a post-exposure bake on a hot plate at 110° C. for 160 seconds. This was developed with 2.38% TMAH developer under the conditions of 23° C. for 1 minute using a spray paddle. The resulting resist pattern was a dot pattern having a pattern width of 1 µm, a space width of 0.3 µm and an aspect ratio of 10.0.

Example 1

Using a 1 liter glass vessel, 16.5 g of a copolymer of a vinylpyrrolidone monomer and a vinylimidazole monomer (molar ratio 1:1) as vinyl resin was dissolved in 78.5 g of pure water to obtain an aqueous solution. 4.9 g of 1,4-diazabicyclo[2.2.2]octane as an amine compound and 0.1 g of a nonionic alkylether-type surfactant (Newcol (trademark) TA-420, manufactured by Nippon Nyukazai Co., Ltd.) were added thereto, and the resultant product was stirred for about 1 hour and thereafter filtered through a 0.05 micron filter to obtain a composition of Example 1.

Examples 2-4 and Comparative Examples 1-8

Except using amine compounds of the amount shown in Table 1 below in place of 4.9 g of the amine compound, 1,4-diazabicyclo[2.2.2]octane, the same manner was carried out as Example 1 to obtain compositions of Examples 2-4 and Comparative Examples 1-8.

In the table, the addition ratio to vinyl resin shows values obtained by dividing the mass of the added amine compound by the mass of the copolymer of the vinylpyrrolidone monomer and the vinylimidazole monomer (16.5 g).

TABLE 1

| | Amine compound | Added mass (g) | Addition ratio to vinyl resin |
|---|---|---|---|
| Example 1 | 1,4-diazabicyclo[2.2.2]octane | 4.9 | 0.30 |
| Example 2 | 1,4-diazabicyclo[2.2.2]octane | 3.3 | 0.20 |
| Example 3 | 1,4-diazabicyclo[2.2.2]octane | 3.0 | 0.18 |
| Example 4 | 1,4-diazabicyclo[2.2.2]octane | 5.8 | 0.35 |
| Comp. Ex. 1 | 2-aminoethanol | 3.3 | 0.20 |
| Comp. Ex. 2 | triethylamine | 3.3 | 0.20 |
| Comp. Ex. 3 | ethylenediamine | 3.3 | 0.20 |
| Comp. Ex. 4 | N,N,N'-triethylethylenediamine | 3.3 | 0.20 |
| Comp. Ex. 5 | Polyethyleneimine *1 | 3.3 | 0.20 |

TABLE 1-continued

|  | Amine compound | Added mass (g) | Addition ratio to vinyl resin |
|---|---|---|---|
| Comp. Ex. 6 | cyclohexylamine | 3.3 | 0.20 |
| Comp. Ex. 7 | 2-(2-aminoethylamino)ethanol | 3.3 | 0.20 |
| Comp. Ex. 8 | 1-(2-hydroxymethyl)-imidazolidinone | 3.3 | 0.20 |

In the table, *1 is EPOMIN (registered trademark), Product No. SP-006, manufactured by Nippon Shokubai Co., Ltd.

Evaluation of Embedding

The compositions obtained in Examples 1 to 4 and Comparative Examples 1 to 8 were coated on the patterned 8-inches wafers obtained according to the Example of resist pattern formation, respectively using a spin coater under conditions of a rotational speed 1500 rpm and a dropping amount 10 cc. These were subjected to a bake on a hot plate at 85° C. for 90 seconds. The cross section of the obtained pattern were observed by means of a scanning electron microscope (Cross Section SEM), and evaluated. As the result, it was found that in all the compositions, the pattern had no voids and was densely packed.

Evaluation of Pattern Shape

Each composition of Examples 1 to 4 and Comparative Examples 1 to 8 was coated on the patterned 8-inches silicon wafer obtained according to the Example of resist pattern formation, using a spin coater under conditions of a rotational speed 1500 rpm and a dropping amount 10 cc. This was subjected to a mixing bake on a hot plate at 130° C. for 90 seconds. Then, this was brought in contact with running pure water for 60 seconds, thereby a shrink layer was formed on the resist pattern surface. A line width of the pattern top and a line width of the pattern bottom after the formation of the shrink layer were measured by means of Cross Section SEM, and evaluated by the ratio of the line width of the top/the line width of the bottom (hereinafter, abbreviated as top/bottom ratio). The evaluation criteria are as follows.

A: top/bottom ratio is greater than 0.8
B: top/bottom ratio is greater than 0.6 and not greater than 0.8
C: top/bottom ratio is not greater than 0.6

Figure 2:
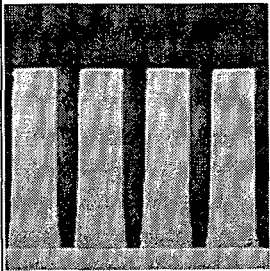
FIG. 2 shows SEM photos for a resist pattern only and for the resist patterns coated with the compositions of Example 1 and Comparative Example 2.

The results obtained were as shown in Table 3. Cross Section SEMs respectively in the case of resist pattern only and in the cases in accordance with Example 1 and Comparative Example 2 are as shown in FIG. 2. The film decreasing rate in the table shows a value obtained by dividing a value, which is obtained by subtracting a value of the film thickness after shrink layer formation from a value of the resist film thickness in the case of resist pattern only, and then it is divided by the value of the resist film thickness in the case of resist pattern only.

TABLE 2

|  | Resist pattern only | Example 1 | Comp. Ex. 2 |
|---|---|---|---|
| Line width of top | 830 nm | 860 nm | 600 nm |
| Line width of bottom | 1000 nm | 1050 nm | 1000 nm |
| Top/bottom ratio | >0.8 | >0.8 | 0.6 |
| Film decreasing rate | — | 0% | 3% |

Evaluation of Size Reduction Rate

In the same manner as described above, a shrink layer was formed. The resist pattern before the shrink layer was formed and the pattern after the shrink layer was formed were observed by means of Cross Section SEM, and the space widths of the resist pattern before and after the shrink layer formation were measured. Here, the space width is a value at the bottom. The evaluation was conducted in accordance with the size reduction rate of the following formula and the evaluation criteria are as follows.

Size reduction rate=[(a space width before the shrink layer formation)−(a space width after the shrink layer formation)]/(a space width before the shrink layer formation)

A: size reduction rate is greater than 15.0
B: size reduction rate is greater than 10.0 and not greater than 15.0
C: size reduction rate is not greater than 10.0

The results obtained were as shown in Table 3.

Evaluation of Defect

After forming a shrink layer in the same manner as described above, the number of defects was measured using a surface defect inspection tool (KLA-2360, manufactured by KLA-Tencor Corporation). The cases of a bridge formation between patterns, a collapsed pattern and an incomplete pattern shape were regarded as a defect. The evaluation criteria are as follows.

A: number of defects is equal with or more than 0 and less than 50
B: number of defects is not less than 50 and less than 100
C: number of defects is not less than 100

The results obtained were as shown in Table 3.

TABLE 3

|  | Pattern shape | | Size reduction rate | | Number of defects | |
|---|---|---|---|---|---|---|
|  | Top/bottom ratio | Eva. | Size reduction rate | Eva. | No. of defects | Eva. |
| Ex. 1 | >0.8 | A | 25.7 | A | 22 | A |
| Ex. 2 | >0.8 | A | 18.3 | A | 23 | A |
| Ex. 3 | >0.8 | A | 13.3 | B | 28 | A |
| Ex. 4 | 0.7 | B | 29.3 | A | 68 | B |
| Comp. Ex. 1 | 0.6 | C | 12.3 | B | 41 | A |
| Comp. Ex. 2 | 0.6 | C | 6.7 | C | 37 | A |
| Comp. Ex. 3 | 0.6 | C | 13.0 | B | 31 | A |
| Comp. Ex. 4 | 0.5 | C | 8.3 | C | 36 | A |
| Comp. Ex. 5 | 0.5 | C | 26.7 | A | 250 | C |
| Comp. Ex. 6 | 0.6 | C | 12.3 | B | 34 | A |

TABLE 3-continued

| | Pattern shape | | Size reduction rate | | Number of defects | |
|---|---|---|---|---|---|---|
| | Top/bottom ratio | Eva. | Size reduction rate | Eva. | No. of defects | Eva. |
| Comp. Ex. 7 | 0.6 | C | 13.0 | B | 216 | C |
| Comp. Ex. 8 | 0.5 | C | 17.3 | A | 168 | C |

EXPLANATION OF SYMBOLS

1. Substrate
2. Resist pattern
3. Composition layer
4. Insolubilized layer
5. Shrink layer
6. Molecules in the resist
7. Molecules of the composition according to the present invention

The invention claimed is:

1. A composition comprising:
vinyl resin;
an amine compound represented by the following formula (I):

[Formula 1]

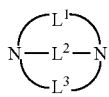

(I)

in which $L^1$, $L^2$ and $L^3$ are each independently a divalent group formed by binding identical or different, two or three bonding units selected from the group consisting of —$CR_2$— (R is each independently hydrogen or an alkyl having 1 to 6 carbon atoms), and
a solvent consisting of water,
with the proviso that the composition does not include an organic solvent.

2. The composition according to claim 1, wherein $L^1$, $L^2$ and $L^3$ are respectively a divalent group formed by binding two bonding units.

3. The composition according to claim 1, wherein the vinyl resin is a water-soluble vinyl resin.

4. The composition according to claim 1, wherein the vinyl resin is derived from a vinyl pyrrolidone monomer and a vinyl imidazole monomer.

5. The composition according to claim 1, wherein the vinyl resin is a polymer represented by the following formula (II):

[Formula 2]

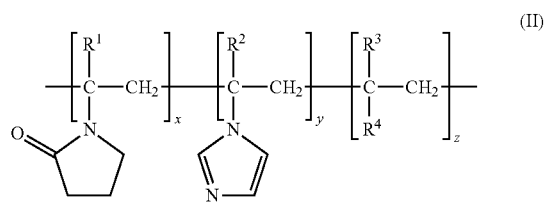

(II)

in which
$R^1$, $R^2$ and $R^3$ are each independently hydrogen or methyl,
$R^4$ is alkyloxycarbonyl, hydroxy alkyloxycarbonyl, alkylcarbonyloxy or hydroxy alkylcarbonyloxy, where alkyl is a straight-chain or branched alkyl having 1 to 6 carbon atoms;
x, y and z are respectively an integer of 5 to 1000; and
each of the repeating units may be randomly bonded, regularly bonded, or bonded in a block.

6. The composition according to claim 5, wherein the mass ratio of the amine compound to vinyl resin is not less than 0.2 and not more than 0.3.

7. The composition according to claim 6, further comprising a surfactant.

8. A method for producing a fine pattern comprising:
a step of forming a resist pattern on a substrate;
a step of applying the composition according to claim 1 on the resist pattern to form a composition layer;
a step of mixing bake of the resist pattern and the composition layer to form an insolubilized layer in the composition layer; and
a step of removing the composition layer other than the insolubilized layer.

9. The method according to claim 8, wherein film thickness of the resist pattern is not less than 1 μm and not more than 10 μm.

10. A method for producing a device comprising:
a step of forming a resist pattern on a substrate;
a step of applying the composition according to claim 1 on the resist pattern to form a composition layer;
a step of mixing bake of the resist pattern and the composition layer to form an insolubilized layer in the composition layer;
a step of removing the composition layer other than the insolubilized layer to form a fine pattern;
a step of ion implantation into the substrate using the fine pattern as a mask; and
a step of removing the fine pattern after the ion implantation.

11. The method according to claim 10, wherein the composition layer other than the insolubilized layer is removed by contacting the composition layer with water, a liquid mixture of a water-soluble organic solvent and water, or an alkali aqueous solution.

12. The composition according to claim 7, wherein the amine compound is selected from the group consisting of 2-methyl-1,4-diazabicyclo[2.2.2]octane, 1,4-diazabicyclo[2.2.2]octane-2-one, 1,4-diaza-2-oxabicyclo[2.2.2]octane, 1,5-diaza-bicyclo-[3.2.2]nonane, 1,5-diazabicyclo[3.3.2]decane, and 1,5-di-azabicyclo[3.3.3]undecane.

13. The composition according to claim 5, wherein the mass ratio of the amine compound to vinyl resin is not less than 0.1 and not more than 0.4.

14. The composition according to claim 1, wherein the mass ratio of the amine compound to vinyl resin is not less than 0.1 and not more than 0.4, and wherein the content of vinyl resin is 10 to 40 parts by mass based on 100 parts by mass of the composition.

15. The composition according to claim 7, wherein $L^1$, $L^2$ and $L^3$ are respectively a divalent group formed by binding two bonding units; and R is hydrogen.

16. A composition consisting of:
vinyl resin;
an amine compound represented by the following formula (I):

[Formula 1]

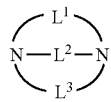

(I)

in which $L^1$, $L^2$ and $L^3$ are each independently a divalent group formed by binding identical or different, two or three bonding units selected from the group consisting of —$CR_2$— (R is each independently hydrogen or an alkyl having 1 to 6 carbon atoms), a surfactant, an additive, and
a solvent consisting of water.

17. The composition of claim 16, wherein the composition consist of a
vinyl resin;
an amine compound represented by the following formula (I):

[Formula 1]

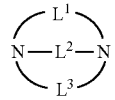

(I)

in which $L^1$, $L^2$ and $L^3$ are each independently a divalent group formed by binding identical or different, two or three bonding units selected from the group consisting of —$CR_2$— (R is each independently hydrogen or an alkyl having 1 to 6 carbon atoms), a surfactant, and
a solvent consisting of water.

* * * * *